United States Patent
Zhang et al.

(10) Patent No.: US 10,217,427 B2
(45) Date of Patent: Feb. 26, 2019

(54) GATE DRIVE UNIT CIRCUIT, GATE DRIVE CIRCUIT, DISPLAY DEVICE AND DRIVING METHOD

(71) Applicant: BOE TECHNOLOGY GROUP CO., LTD., Beijing (CN)

(72) Inventors: Yuanbo Zhang, Beijing (CN); Seungwoo Han, Beijing (CN); Xing Yao, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 140 days.

(21) Appl. No.: 15/513,952

(22) PCT Filed: Feb. 29, 2016

(86) PCT No.: PCT/CN2016/074815
§ 371 (c)(1),
(2) Date: Mar. 23, 2017

(87) PCT Pub. No.: WO2017/054403
PCT Pub. Date: Apr. 6, 2017

(65) Prior Publication Data
US 2018/0350315 A1    Dec. 6, 2018

(30) Foreign Application Priority Data
Sep. 30, 2015 (CN) .......................... 2015 1 0635164

(51) Int. Cl.
*G09G 3/36* (2006.01)

(52) U.S. Cl.
CPC ....... *G09G 3/3677* (2013.01); *G09G 2310/06* (2013.01); *G09G 2330/021* (2013.01)

(58) Field of Classification Search
CPC ............. G09G 3/3677; G09G 2310/06; G09G 2330/021
See application file for complete search history.

(56) References Cited

U.S. PATENT DOCUMENTS 8,587,347 B2    11/2013    Yoon et al.
2012/0262438 A1    10/2012    Shang et al.
(Continued)

FOREIGN PATENT DOCUMENTS

CN    102651238 A    8/2012
CN    103187040 A    7/2013
(Continued)

OTHER PUBLICATIONS

Office Action in Chinese Application No. 201510635164.6 dated Apr. 14, 2017, with English translation.
(Continued)

*Primary Examiner* — Abhishek Sarma
(74) *Attorney, Agent, or Firm* — Womble Bond Dickinson (US) LLP

(57) ABSTRACT

The present application relates to a gate drive unit circuit, comprising an input unit, an output unit, a pull-up node control unit, a pull-down node control unit and a pull-down unit. The input unit is used for transmitting a signal inputted by a first input signal terminal to a first node. The pull-up node control unit is used for transmitting a signal inputted by a first voltage terminal or a second voltage terminal to a pull-up node. The output unit is used for transmitting a signal inputted by a first control signal terminal to an output signal terminal. The pull-down node control unit is used for transmitting the input inputted by the first voltage terminal or the second voltage terminal to a pull-down node. The pull-down unit is used for transmitting a signal inputted by the second voltage terminal to the output signal terminal.

9 Claims, 8 Drawing Sheets

(56) References Cited

U.S. PATENT DOCUMENTS

| | | | |
|---|---|---|---|
| 2013/0181747 A1* | 7/2013 | Yoon | G11C 19/184 327/108 |
| 2015/0213746 A1 | 7/2015 | Kim et al. | |
| 2016/0307537 A1* | 10/2016 | Park | G09G 3/3677 |
| 2016/0351156 A1 | 12/2016 | Wu et al. | |
| 2017/0018243 A1 | 1/2017 | Huang et al. | |
| 2017/0256220 A1* | 9/2017 | Huang | G09G 3/3677 |

FOREIGN PATENT DOCUMENTS

| | | |
|---|---|---|
| CN | 103928009 A | 7/2014 |
| CN | 103985339 A | 8/2014 |
| CN | 104240765 A | 12/2014 |
| CN | 104318909 A | 1/2015 |
| CN | 104700803 A | 6/2015 |
| CN | 104732946 A | 6/2015 |
| CN | 105096904 A | 11/2015 |
| KR | 101345828 B1 | 12/2013 |

OTHER PUBLICATIONS

International Search Report with English language translation, dated Jul. 8, 2016, International Application No. PCT/CN2016/074815.

Written Opinion received for PCT Patent Application No. PCT/CN2016/074815, dated Jul. 8, 2016, 12 pages (7 pages of English Translation and 5 pages of Original Document).

Office Action received for Chinese Patent Application No. 201510635164.6, dated Nov. 28, 2017, 26 pages (14 pages of English Translation and 12 pages of Office Action).

International Preliminary Report on Patentability received for PCT Patent Application No. PCT/CN2016/074815, dated Apr. 12, 2018, 15 pages (9 pages of English Translation and 6 pages of Original Document).

* cited by examiner

GATE DRIVE UNIT CIRCUIT, GATE DRIVE CIRCUIT, DISPLAY DEVICE AND DRIVING METHOD

The present application is the U.S. national phase entry of PCT/CN2016/074815, with an international filing date of Feb. 29, 2016, which claims the benefit of Chinese Patent Application No. 201510635164.6, filed on Sep. 30, 2015, the entire disclosure of which is incorporated herein by reference.

TECHNICAL FIELD

The present application relates to the field of display technology, particularly to a gate drive unit circuit, a gate drive circuit and a driving method thereof, as well as a display device comprising the gate drive circuit.

BACKGROUND

In recent years, the development of the liquid crystal display has presented a development trend of high integration and low cost. One of the very important technologies is the realization of mass production of the gate driver on array (GOA) technology. The GOA technology is a technology that forms the gate drive circuit on an array substrate directly to replace the driver wafer fabricated by an external wafer. The application of the GOA technology can simplify the fabricating process, reduce the product cost, improve the integration of the display panel, and enable the panel to be thinner. Such a circuit integrated on the array substrate using the GOA technology is also called a GOA circuit.

The shift register circuit (i.e., the gate drive circuit) generally includes several shift register unit circuits (i.e., gate drive unit circuits). As shown in FIG. 1, in the shift register unit circuit of the prior art, the pull-up node PU and the pull-down node PD are generally designed to be inverters for each other; hence, when the pull-up node PU is charged, a direct current generally passes through the pull-down node PD, thereby resulting in loss of the direct current. In addition, the shift register unit circuit has a relatively poor stability. If the variation of the characteristics, particularly the threshold voltage of the thin film transistors (TFT) that form the circuit reaches a certain degree, the shift register unit circuit will not work normally. For example, as shown in FIG. 1, if the threshold voltage of the TFT M10 drifts in a negative direction, the electric leakage of the pull-up node PU through the TFT M10 will increase; hence, the problem that the pull-up node PU cannot be charged normally will occur. Thus, the potential of the pull-down node PD cannot be pulled down by the pull-up node PU either, thereby resulting in failure of normal output.

SUMMARY

With respect to the above technical problem in the prior art, the concept of the present application is proposed. The gate drive circuit according the concept of the present application can reduce the power consumption and improve stability of the circuit. In addition, it can also reduce the size of the thin film transistors that constitute the gate drive circuit, and simplify the circuit.

According to an aspect of the present application, a gate drive unit circuit is provided, comprising an input unit, an output unit, a pull-up node control unit, a pull-down node control unit and a pull-down unit. The input unit is connected to the pull-up node control unit and the pull-down node control unit through a first node, the pull-up node control unit is connected to the output unit through a pull-up node, and the pull-down node control unit is connected to the pull-up node control unit and the pull-down unit through a pull-down node. The input unit is connected to a first input signal terminal, a first control terminal and the first node, for transmitting a signal inputted by the first input signal terminal to the first node under control of a signal inputted by the first control terminal. The pull-up node control unit is connected to the first node, the pull-up node, the pull-down node, a first voltage terminal and a second voltage terminal, for transmitting a signal inputted by the first voltage terminal or the second voltage terminal to the pull-up node under control of the first node and the pull-down node. The output unit is connected to the pull-up node, a first control signal terminal and an output signal terminal, for transmitting a signal inputted by the first control signal terminal to the output signal terminal under control of the pull-up node. The pull-down node control unit is connected to the first node, the pull-down node, the first voltage terminal, the second voltage terminal, a second control signal terminal and the output signal terminal, for transmitting the signal inputted by the first voltage terminal or the second voltage terminal to the pull-down node under control of a signal inputted by the second control signal terminal, the first node and a signal outputted by the output signal terminal. The pull-down unit is connected to the pull-down node, the output signal terminal and the second voltage terminal, for transmitting a signal inputted by the second voltage terminal to the output signal terminal under control of the pull-down node.

According to embodiments of the present application, when the pull-up node control unit transmits the signal inputted by the first voltage terminal to the pull-up node under the control of the first node, the signal inputted by the second control signal terminal enables the pull-down node control unit to control a potential of the pull-down node to be unrelated to the signal inputted by the first voltage terminal.

According to embodiments of the present application, the signal inputted by the first control signal terminal is a first control signal, and the signal inputted by the second control signal terminal is a second control signal. The first control signal and the second control signal are clock control signals and have the same cycle and duty ratio, and the phase difference is 180 degrees. In one cycle, the ratio of the time length of the first control signal and the second control signal in a first potential state and the time length in a second potential state can be 25% respectively.

According to embodiments of the present application, the input unit is further connected to a second input signal terminal and a second control terminal, and is used for transmitting the signal inputted by the first input signal terminal to the first node under control of the signal inputted by the first control terminal, or transmitting a signal inputted by the second input signal terminal to the first node under control of a signal inputted by the second control terminal.

According to embodiments of the present application, the input unit comprises a first transistor. The first input signal terminal is connected to a drain of the first transistor, the first control terminal is connected to a gate of the first transistor, and a source of the first transistor is connected to the first node.

According to embodiments of the present application, the input unit can comprise a first transistor and a second transistor. The first input signal terminal is connected to a drain of the first transistor, the first control terminal is connected to a gate of the first transistor, the second input signal terminal is connected to a drain of the second transistor, the second control terminal is connected to a gate of the second transistor, and a source of the first transistor and a source of the second transistor are jointly connected to the first node.

According to embodiments of the present application, the pull-up node control unit comprises a seventh transistor and a tenth transistor. The first node is connected to a gate of the seventh transistor, the pull-down node is connected to a gate of the tenth transistor, the first voltage terminal is connected to a drain of the seventh transistor, the second voltage terminal is connected to a source of the tenth transistor, and a source of the seventh transistor and a drain of the tenth transistor are jointly connected to the pull-up node.

According to embodiments of the present application, the pull-down node control unit comprises a fifth transistor, a sixth transistor and an eighth transistor. The first node is connected to a gate of the sixth transistor, the output signal terminal is connected to a gate of the eighth transistor, the second control signal terminal is connected to a gate of the fifth transistor, the first voltage terminal is connected to a drain of the fifth transistor, the second voltage terminal is connected to a source of the sixth transistor and a source of the eighth transistor, and a source of the fifth transistor, a drain of the sixth transistor and a drain of the eighth transistor are jointly connected to the pull-down node.

According to embodiments of the present application, the pull-down node control unit further comprises a ninth transistor. The second control signal terminal is connected to a source of the ninth transistor, a drain of the ninth transistor is connected to the gate of the fifth transistor, and the first voltage terminal is connected to a gate of the ninth transistor.

According to embodiments of the present application, the output unit can comprise a third transistor and a first capacitor. The pull-up node is connected to a gate of the third transistor and a first terminal of the first capacitor, the first control signal terminal is connected to a drain of the third transistor, and a source of the third transistor and a second terminal of the first capacitor are jointly connected to the output signal terminal.

According to embodiments of the present application, the pull-down unit can comprise an eleventh transistor and a second capacitor. The pull-down node is connected to a gate of the eleventh transistor and a first terminal of the second capacitor, a drain of the eleventh transistor is connected to the output signal terminal, and the second voltage terminal is connected to a source of the eleventh transistor and a second terminal of the second capacitor.

According to embodiments of the present application, the signal applied to one of the first voltage terminal and the second voltage terminal is of high potential, meanwhile, the signal applied to the other of the first voltage terminal and the second voltage terminal is of low potential.

According to another aspect of the present application, a gate drive circuit is provided, comprising a plurality of cascaded gate drive unit circuits according to the present application. An output signal terminal of a gate drive unit circuit of one stage is connected with a first input signal terminal of a gate drive unit circuit of a next stage.

According to embodiments of the present application, the first control signal terminal and the second control signal terminal of the gate drive unit circuit receive two signals of a first clock signal, a second clock signal, a third clock signal and a fourth clock signal respectively. The first clock signal to the fourth clock signal have the same cycle and duty ratio. In one cycle, the duty ratios of the first clock signal to the fourth clock signal are all 25%. A phase difference between the second clock signal and the first clock signal is 90 degrees, a phase difference between the third clock signal and the second clock signal is 90 degrees, and a phase difference between the fourth clock signal and the third clock signal is 90 degrees. The first clock signal and the third clock signal constitute a first control signal group, the second clock signal and the fourth clock signal constitute a second control signal group. The first control signal group controls gate drive unit circuits of odd stages, and the second control signal group controls gate drive unit circuits of even stages.

According to embodiments of the present application, the input unit of each of the plurality of gate drive unit circuits is further connected to a second input signal terminal and a second control terminal, and is used for transmitting the signal inputted by the first input signal terminal to the first node under the control of the signal inputted by the first control terminal, or for transmitting a signal inputted by the second input signal terminal to the first node under the control of a signal inputted by the second control terminal. An output signal terminal of a gate drive unit circuit of one stage is connected with the second input signal terminal of a gate drive unit circuit of a previous stage.

According to another aspect of the present application, a display device is provided, comprising a gate drive circuit according to the present application.

According to another aspect of the present application, a method for driving a gate drive unit circuit according to the present application is provided, comprising an input phase, an output phase, a first reset phase and a second reset phase. In the input phase, the signal applied to the first input signal terminal and the signal applied to the first control terminal enable the pull-up node control unit to transmit the signal inputted by the first voltage terminal to the pull-up node under the control of the first node, and enable the pull-down node control unit to transmit the signal inputted by the second voltage terminal to the pull-down node under the control of the first node, and the signal applied to the second control signal terminal enables the pull-down node control unit not to transmit the signal inputted by the first voltage terminal to the pull-down node.

According to embodiments of the present application, in the output phase, the signal applied to the first control signal terminal enables the pull-down node control unit to transmit the signal inputted by the second voltage terminal to the pull-down node under the control of the signal outputted by the output signal terminal.

According to embodiments of the present application, in the first reset phase, the signal applied to the second control signal terminal enables the pull-down node control unit not to transmit the signal inputted by the first voltage terminal to the pull-down node, and the signal applied to the first input signal terminal enables the output signal terminal to be reset.

According to embodiments of the present application, in the second reset phase, the signal applied to the second control signal terminal enables the pull-down node control unit to transmit the signal inputted by the first voltage terminal to the pull-down node, thereby enabling the pull-down unit to transmit the signal inputted by the second voltage terminal to the output signal terminal under the control of the pull-down node, so as to reset the output signal terminal, and enables the pull-up node control unit to transmit the signal inputted by the second voltage terminal to the pull-up node under the control of the pull-down node, so as to reset the pull-up node.

According to embodiments of the present application, in the input phase, the signal applied to the first input signal terminal is at a first potential, and the signal applied to the first control signal terminal and the signal applied to the second control signal terminal are at a second potential.

According to embodiments of the present application, in the output phase, the signal applied to the first control signal terminal is at a first potential, and the signal applied to the first input signal terminal and the signal applied to the second control signal terminal are at a second potential.

According to embodiments of the present application, in the first reset phase, the signal applied to the first input signal terminal, the signal applied to the first control signal terminal and the signal applied to the second control signal terminal are all at a second potential.

According to embodiments of the present application, in the second reset phase, the signal applied to the second control signal terminal is at a first potential, and the signal applied to the first input signal terminal and the signal applied to the first control signal terminal are at a second potential.

According to embodiments of the present application, one of the first potential and the second potential is a high potential, the other is a low potential.

According to embodiments of the present application, the time lengths of the input phase, the output phase, the first reset phase and the second reset phase are all equal.

According to embodiments of the present application, the input unit can be further connected to a second input signal terminal and a second control terminal, and is used for transmitting the signal inputted by the first input signal terminal to the first node under the control of the signal inputted by the first control terminal, or for transmitting a signal inputted by the second input signal terminal to the first node under the control of a signal inputted by the second control terminal. The method further comprises: the signal applied to the first control terminal and the signal applied to the second control terminal in the input phase enable the input unit to only transmit one of the signal inputted by the first input signal terminal and the signal inputted by the second input signal terminal to the first node.

BRIEF DESCRIPTION OF THE DRAWINGS

Through the following detailed description with reference to the drawings, the above and other aspects, features and other advantages will be understood more clearly, wherein.

DETAILED DESCRIPTION

Figure 1:
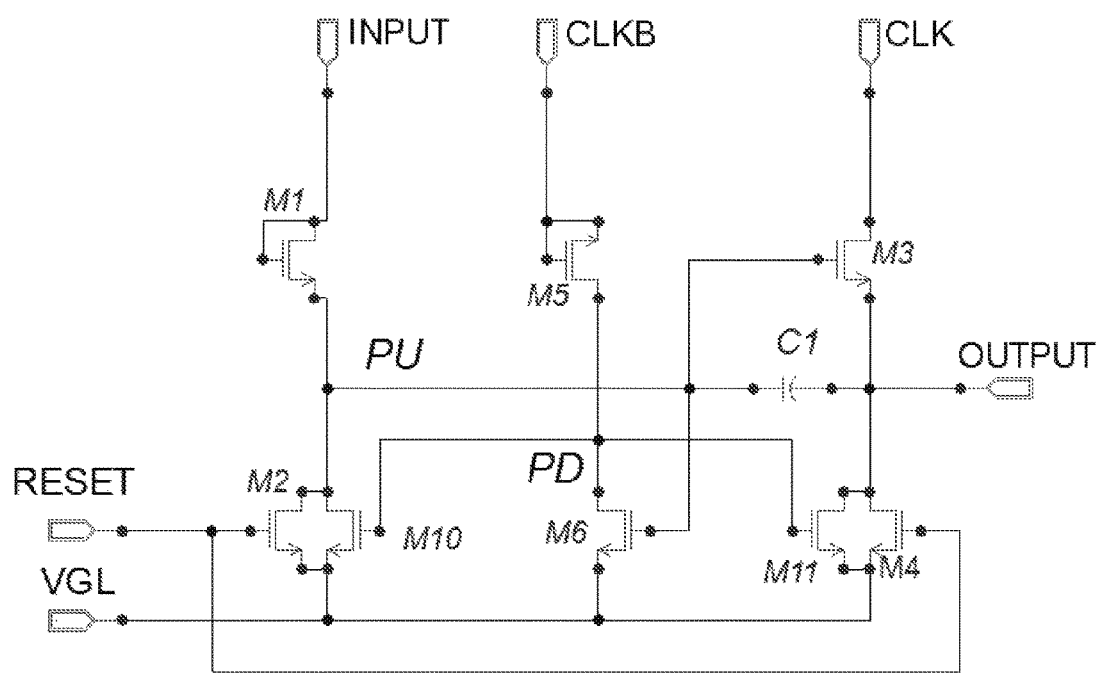
FIG. 1 shows a schematic circuit diagram of a shift register unit circuit in the prior art.

Thereinafter, exemplary embodiments of the concept of the present application will be described in detail with reference to the drawings.

However, the concept of the present application can be illustrated in various forms, and should not be understood as the specific embodiments elaborated in this text. In addition, these embodiments are provided in order to enable this disclosure to be thorough and complete, and to communicate the scope of the concept of the present application to the skilled person in the art completely.

For the sake of clarity, the shapes and sizes of the elements can be exaggerated in the drawings. Moreover, the same reference sign will be used to indicate the same or similar element throughout.

Unless otherwise specified, all the terms (including technical and scientific terms) used in this text have the same meanings as generally understood by the ordinary skilled person in the art of the present application. It should also be understood that unless explicitly defined in this text, those terms such as defined in the general dictionary should be construed as having meanings consistent with their meanings in the context of the related technologies and/or this Specification, and should not be construed in an idealized or overly formal sense.

The transistors used in embodiments of the present application can be thin film transistors or field effect transistors or other similar devices. Because the source and the drain of the transistor used are symmetrical, there is no difference between the source and the drain thereof. In addition, the transistors can be classified in to N-type transistors and P-type transistors.

FIG. 1 shows a schematic circuit diagram of a shift register unit circuit in the prior art.

As shown in FIG. 1, the control signals of the shift register unit circuit in the prior art generally include an actuation signal applied to the input terminal INPUT, a first and second control signal applied to the first control signal terminal CLK and the second control signal terminal CLKB, a reset signal applied to the reset terminal RESET, a low potential signal applied to the second voltage terminal VDD and an optional high potential signal etc. The actuation signal is generally generated by the shift register unit circuit of a previous stage (i.e., the output signal generated by the shift register unit circuit of the previous stage). For the first (or first few) shift register unit circuit in the cascade connection, the system can provide a specified STV signal as the actuation signal when each frame starts.

There are two important nodes in the circuit structure as shown in FIG. 1: a pull-up node PU and a pull-down node PD. Generally, the output of the shift register unit circuit mainly depends on the two nodes for control.

Figure 2:
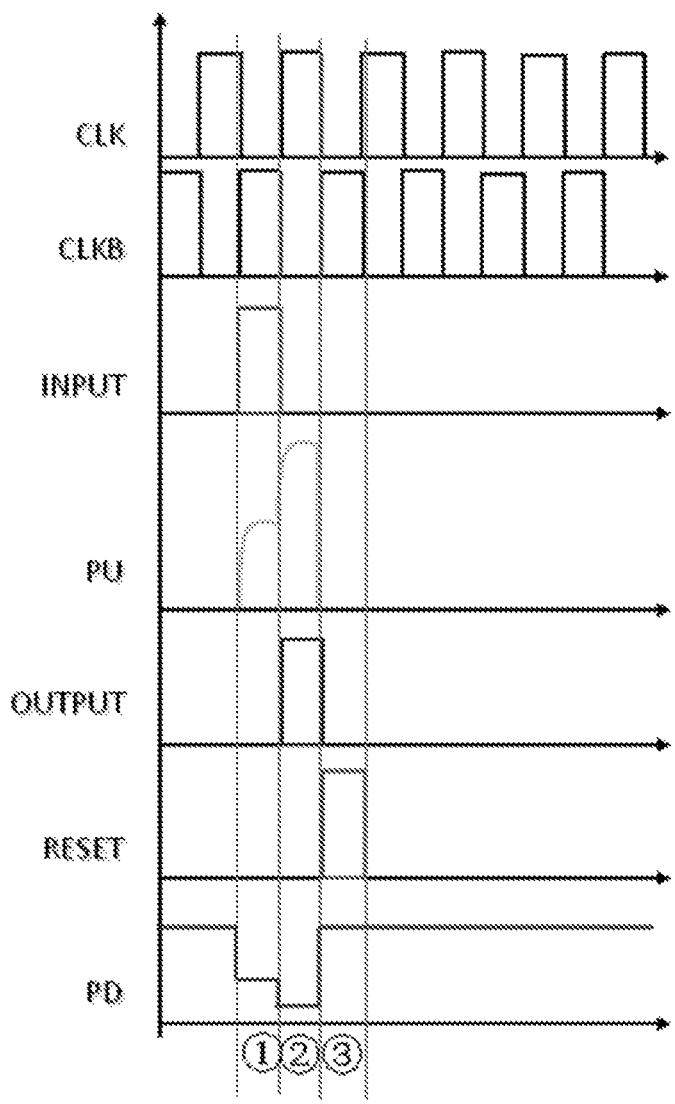
FIG. 2 shows the operating process of the shift register unit circuit as shown in FIG. 1 and waveform schematic views of respective terminals and nodes.
Figure 3:
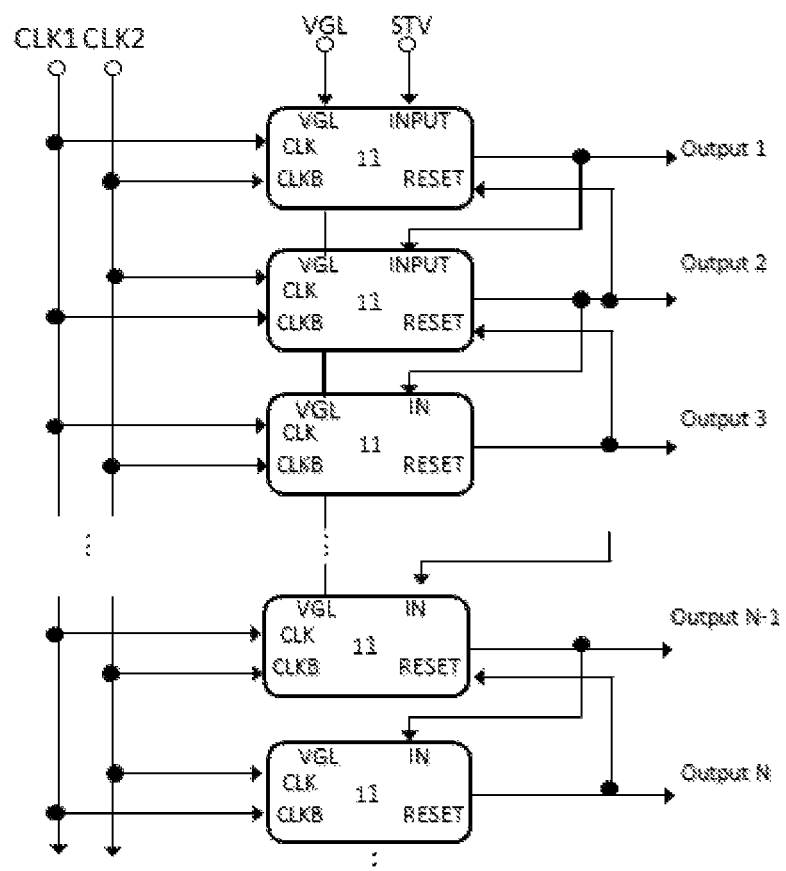
FIG. 3 is a schematic view of a shift register circuit formed by cascading the shift register unit circuits as shown in FIG. 1.

FIG. 2 shows the operating process of the shift register unit circuit as shown in FIG. 1, and waveform schematic views of respective terminals and node, and FIG. 3 is a schematic view of a shift register circuit formed by cascading the shift register unit circuits as shown in FIG. 1. It should be recognized that FIG. 2 shows respective waveform schematic views by taking an example that the transistors in the circuit of FIG. 1 are N-type thin film transistors (TFT).

Referring to FIG. 1 and FIG. 2, in the input phase ①, the actuation signal applied to the TFT M1 through the input terminal INPUT pulls up the potential of the pull-up node PU through the TFT M1, the pull-up node PU at the high potential turns on the TFT M6, and then applies the low potential signal of the second voltage terminal VGL to the pull-down node PD simultaneously. Here, the second control signal of the second control signal terminal CLKB is of a high potential; thus, M5 is turned on and the second control signal is transmitted to the pull-down node PD. By setting the channel width and length ratio of M5 and M6, the potential of the pull-down node PD can be pulled down to a relatively low potential. Here, because the second control signal applied to the second control signal terminal CLKB is of high potential, TFT M5 is thus turned on; hence, a direct current will appear between the high potential signal and the low potential signal VGL of the second control signal terminal CLKB. The potential of the pull-down node PD will be determined by a turn-on resistance ratio of the TFT M5 and the TFT M6 (i.e., being determined based on the principle of resistance voltage divider). Therefore, in such a design, the turn-on resistance of the TFT M6 is generally smaller than the turn-on resistance of the TFT M5, such that the potential of the pull-down node PD approaches the low potential signal VGL as far as possible. However, the potential of the pull-down node PD will be still higher than the low potential signal VGL; hence, part of the charges of the pull-up node PU will still be leaked through the TFT M10 to the low potential signal VGL. The power consumption of the shift register unit circuit will be increased due to the above two DC currents.

In the output phase ②, the first control signal applied to the first control signal terminal CLK rises; hence, the first control signal charges the output terminal OUTPUT to a high potential through the TFT M3, so as to charge the pixels. Meanwhile, the pull-up node PU is coupled to a higher potential through the capacitance of the capacitor C1 and the TFT M3, thereby increasing the charging current so as to ensure that the gate line can reach the desired voltage more quickly. Here, the second control signal of the second control signal terminal CLKB is of a low potential; hence, the M5 is cut off, and the pull-down node PD will be pulled down to the low potential signal of the second voltage terminal VGL through the M6 that has been turned on.

In the reset phase ③, the output terminal OUTPUT (as shown in FIG. 3) of the shift register unit circuit of a next stage connected to the reset terminal RESET of the current shift register unit circuit begins to output a high potential, so as to serves as a reset signal that enables the current shift register unit circuit to be reset. In addition, the system has to provide an extra reset circuit for the shift register unit circuit of the last stage. The high potential reset signal pulls the potential of the pull-up node PU and the potential of the output terminal OUTPUT down to the low potential through TFT M2 and TFT M4. Here, the second control signal applied to the second control signal terminal CLKB is of a high potential; hence, the potential of the pull-down node PD is pulled up through TFT M5, so as to turn on TFT M10 and TFT M11, thereby helping the high potential reset signal to pull down the potentials of the pull-up node PU and the output terminal OUTPUT together. Thus, the charging of the pixels of the current row is finished.

Within one frame, in other operation time except the above phases ①, ② and ③, the second control signal applied to the second control signal terminal CLKB is of a high potential periodically, thereby ensuring that the potential of the pull-down node PD is always a high potential, so as to restrain noise accumulation on the pull-up node PU and the output terminal OUTPUT, and ensure normal operation of the shift register circuit.

As shown in FIG. 2, the voltages of the first control signal and the second control signal applied to the first control signal terminal CLK and the second control signal terminal CLKB respectively keep at a reciprocal state.

In the above circuit structure of the prior art, the second control signal applied to the second control signal terminal CLKB pulls down the potentials of the pull-up node PU and the output terminal OUTPUT periodically through the pull-down node PD as well as TFT M10 and TFT M11, so as to remove the noise. In addition, the actuation signal applied to the input terminal INPUT of the shift register unit circuit is the output signal of the shift register unit circuit of the previous stage, such that the time period in which the second control signal applied to the second control signal terminal CLKB is of a high potential corresponds to the time period in which the actuation signal applied to the input terminal INPUT is of a high potential (i.e., the input phase ①). Therefore, in the input phase ①, it must be ensured that the potential of the pull-down node PD will not become high because the second control signal applied to the second control signal terminal CLKB is of a high potential; otherwise, the pull-down node PD at the high potential will turn on TFT M10 and TFT M11, and maintain the potentials of the pull-up node PU and the output terminal OUTPUT at a low potential; hence, the shift register cannot operate normally. Therefore, in the prior art as shown in FIG. 1, the pull-up node PU pulls down the potential of the pull-down node PD through TFT M6, and the turn-on resistance of TFT M6 is smaller than that of TFT M5, so as to ensure that the potential of the pull-down node PD can be pulled down, so as to accomplish normal charging of the pull-up node PU and ensure normal output of the subsequent output terminal OUTPUT. However, in such a circuit structure of the prior art, the above problem of direct current leakage may occur, such that the power consumption of the shift register unit circuit will rise.

In addition, from the above analysis it can be seen that one of the potentials of the pull-down node PD and the pull-up node PU has to keep at a high potential and the other at a low potential in the input phase and the output phase; hence, with the decline of the device characteristics, the case that the pull-down node PD cannot perform discharging to the pull-up node PU sufficiently or the pull-up node PU cannot be charged normally may occur. Therefore, the case of multiple output or no output may occur to the shift register unit circuit, and the stability will be relatively poor.

With respect to the above technical problem in the prior art, the present application enables the potential of the pull-down node PD to be a stable low potential when the pull-up node PU is of a high potential in the input phase, thereby reducing the power consumption and improving the stability of the circuit.

Figure 4:
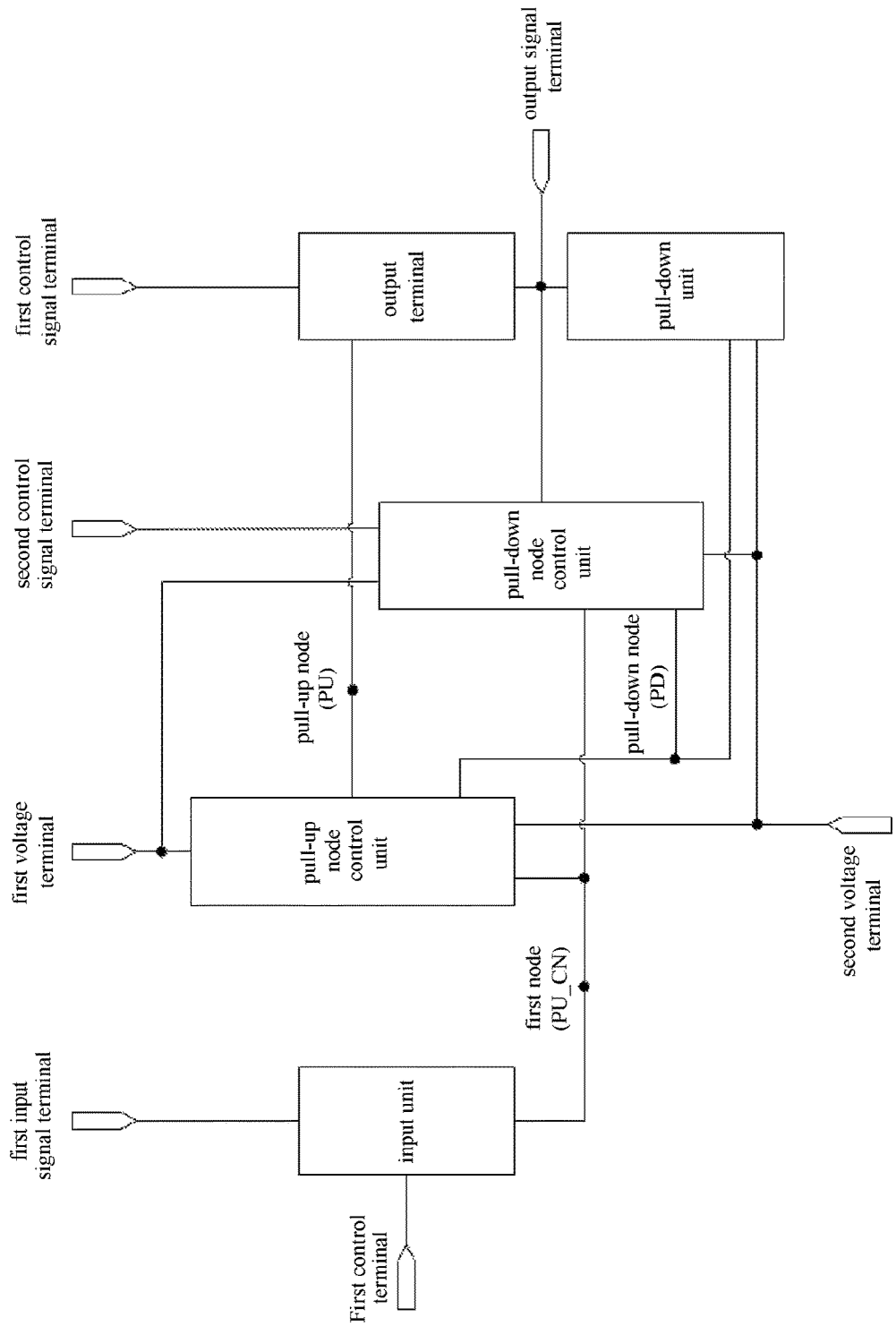
FIG. 4 is a schematic block diagram of a gate drive unit circuit according to an embodiment of the present application.

FIG. 4 is a schematic block diagram of a gate drive unit circuit according to an embodiment of the present application.

Referring to FIG. 4, the gate drive unit circuit according to an embodiment of the present application comprises an input unit, an output unit, a pull-up node control unit, a pull-down node control unit and a pull-down unit. The input unit is connected to the pull-up node control unit and the pull-down node control unit through a first node PU_CN, the pull-up node control unit is connected to the output unit through a pull-up node PU, and the pull-down node control unit is connected to the pull-up node control unit and the pull-down unit through a pull-down node PD.

The input unit is connected to a first input signal terminal, a first control terminal and the first node PU_CN, for transmitting a signal inputted by the first input signal terminal to the first node PU_CN under control of a signal inputted by the first control terminal.

The pull-up node control unit is connected to the first node PU_CN, the pull-up node PU, the pull-down node PD, a first voltage terminal and a second voltage terminal, for transmitting a signal inputted by the first voltage terminal to the pull-up node PU under control of the first node PU_CN, and for transmitting a signal inputted by the second voltage terminal to the pull-up node PU under control of the pull-down node PD.

The output unit is connected to the pull-up node PU, a first control signal terminal and an output signal terminal, for transmitting a signal inputted by the first control signal terminal to the output signal terminal under control of the pull-up node PU.

The pull-down node control unit is connected to the first node PU_CN, the pull-down node PD, the first voltage terminal, the second voltage terminal, a second control signal terminal and the output signal terminal, for transmitting the signal inputted by the first voltage terminal to the pull-down node PD under control of a signal inputted by the second control signal terminal, and for transmitting the signal inputted by the second voltage terminal to the pull-down node PD under control of the first node PU_CN or under control of a signal outputted by the output signal terminal.

The pull-down unit is connected to the pull-down node PD, the output signal terminal and the second voltage terminal, for transmitting a signal inputted by the second voltage terminal to the output signal terminal under control of the pull-down node PD.

Figure 5:
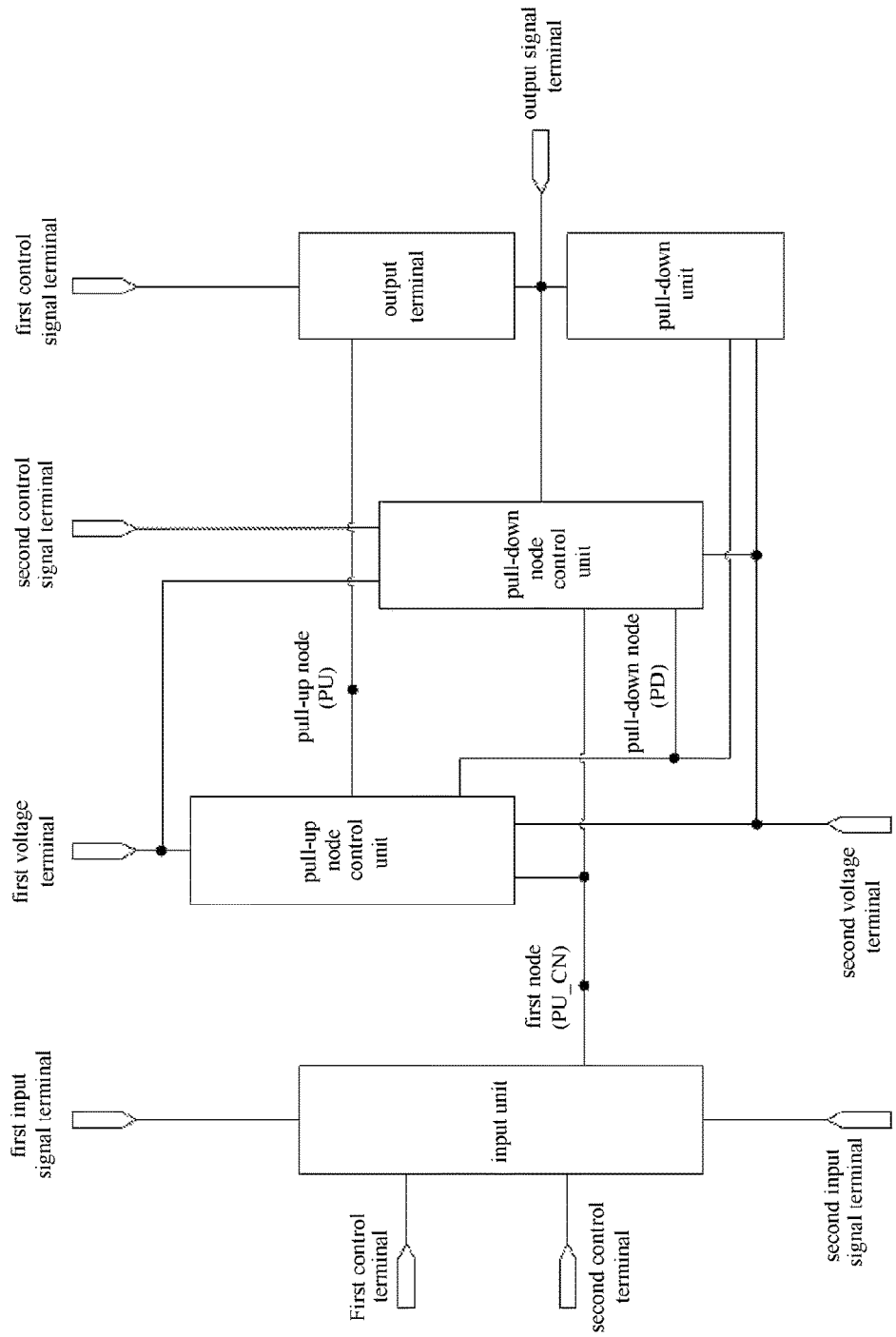
FIG. 5 is a schematic block diagram of a gate drive unit circuit according to another embodiment of the present application.

FIG. 5 is a schematic block diagram of a gate drive unit circuit according to another embodiment of the present application. Compared with the embodiment as shown in FIG. 4, in the embodiment as shown in FIG. 5, the input unit of the gate drive unit circuit can be further connected to a second input signal terminal and a second control terminal, and is used for transmitting the signal inputted by the first input signal terminal to the first node under control of the signal inputted by the first control terminal, or transmitting a signal inputted by the second input signal terminal to the first node under control of a signal inputted by the second control terminal.

Figure 6:
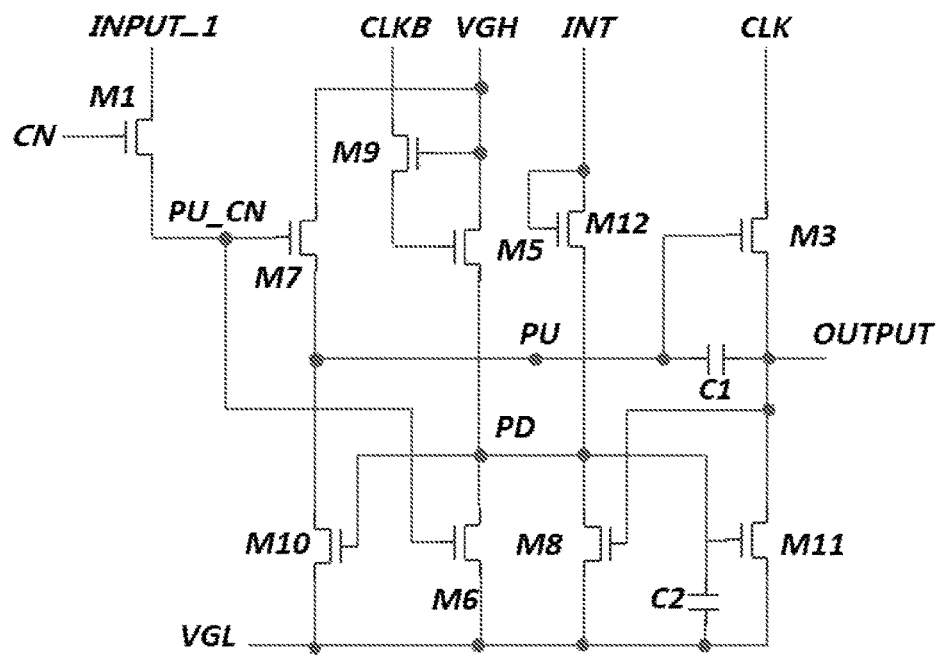
FIG. 6 is a circuit schematic view of a gate drive unit circuit according to an embodiment of the present application.

FIG. 6 is a circuit schematic view of a gate drive unit circuit according to an embodiment of the present application. It should be recognized that FIG. 6 illustrates a circuit schematic view of a gate drive unit circuit by taking N-type transistors as an example; however, the present application is not limited to this. Other types of transistors (e.g., P-type transistors) can also be used to implement the gate drive unit circuit of the present application, and adjust the setting manners of the high potential and the low potential correspondingly.

Referring to FIG. 4 and FIG. 6, the input unit of the gate drive unit circuit according to embodiments of the present application can comprise a first transistor M1. The first input signal terminal INPUT_1 is connected to a drain of the first transistor M1, the first control terminal CN is connected to a gate of the first transistor M1, and a drain of the first transistor M1 is connected to the first node PU_CN.

The pull-up node control unit of the gate drive unit circuit according to embodiments of the present application can comprise a seventh transistor M7 and a tenth transistor M10. The first node PU_CN is connected to a gate of the seventh transistor M7, the pull-down node PD is connected to a gate of the tenth transistor M10, the first voltage terminal VGH is connected to a drain of the seventh transistor M7, the second voltage terminal VGL is connected to a source of the tenth transistor M10, and a source of the seventh transistor M7 and a drain of the tenth transistor M10 are jointly connected to the pull-up node PU.

The pull-down node control unit of the gate drive unit circuit according to embodiments of the present application can comprise a fifth transistor M5, a sixth transistor M6 and an eighth transistor M8. The first node PU_CN is connected to a gate of the sixth transistor M6, the output signal terminal OUTPUT is connected to a gate of the eighth transistor M8, the second control signal terminal CLKB is connected to a gate of the fifth transistor M5, the first voltage terminal VGH is connected to a drain of the fifth transistor M5, the second voltage terminal is connected to a source of the sixth transistor M6 and a source of the eighth transistor M8, and a source of the fifth transistor M5, a drain of the sixth transistor M6 and a drain of the eighth transistor M8 are jointly connected to the pull-down node PD.

In addition, as shown in FIG. 6, the pull-down node control unit can further comprise a ninth transistor M9. And the signal inputted by the second control signal terminal CLKB is applied to a gate of the fifth transistor M5 through the ninth transistor M9. Specifically, the second control signal terminal CLKB is connected to a source of the ninth transistor M9, a drain of the ninth transistor M9 is connected to the gate of the fifth transistor M5, and the first voltage terminal VGH is connected to a gate of the ninth transistor M9.

The output unit of the gate drive unit circuit according to embodiments of the present application can comprise a third transistor M3 and a first capacitor C1. The pull-up node PU is connected to a gate of the third transistor M3 and a first terminal of the first capacitor C1, the first control signal terminal CLK is connected to a drain of the third transistor M3, and a source of the third transistor M3 and a second terminal of the first capacitor C1 are jointly connected to the output signal terminal OUTPUT. The first capacitor C1 is used for enabling the voltage of the pull-up node PU to be coupled to a higher potential in the output phase, so as to ensure that the gate drive unit circuit outputs a high potential signal in the output phase.

The pull-down unit of the gate drive unit circuit according to embodiments of the present application can comprise an eleventh transistor M11 and a second capacitor C2. The pull-down node PD is connected to a gate of the eleventh transistor M11 and a first terminal of the second capacitor C2, a drain of the eleventh transistor M11 is connected to the output signal terminal OUTPUT, and the second voltage terminal is connected to a source of the eleventh transistor M11 and a second terminal of the second capacitor C2. The second capacitor C2 is used for keeping the eleventh transistor M11 to be turned on when the potential of the pull-down node PD jumps.

According to embodiments of the present application, the signal applied to one of the first voltage terminal and the second voltage terminal is of high potential, meanwhile, the signal applied to the other of the first voltage terminal and the second voltage terminal is of low potential. Although FIG. 6 shows that the signal applied to the first voltage terminal is of high potential, and the signal applied to the second voltage terminal is of low potential, the present application is not limited to this. The skilled person in the art can adjust the potentials applied to the first voltage terminal and the second voltage terminal appropriately based on the type (N-type or P-type) of the transistors for forming the gate drive unit circuit.

According to embodiments of the present application, when the pull-up node control unit transmits the high potential of the first voltage terminal to the pull-up node PU under the control of the first node PU_CN, the signal inputted by the second control signal terminal CLKB enables the pull-down node control unit to transmit the low potential of the second voltage terminal to the pull-down node PD, so as to enable the pull-down node PD to have a stable low potential, whereas the pull-down node PD will not be influenced by the high potential of the first voltage terminal either, i.e., here the potential of the pull-down node PD is unrelated to the signal inputted by the first voltage terminal.

Figure 7:
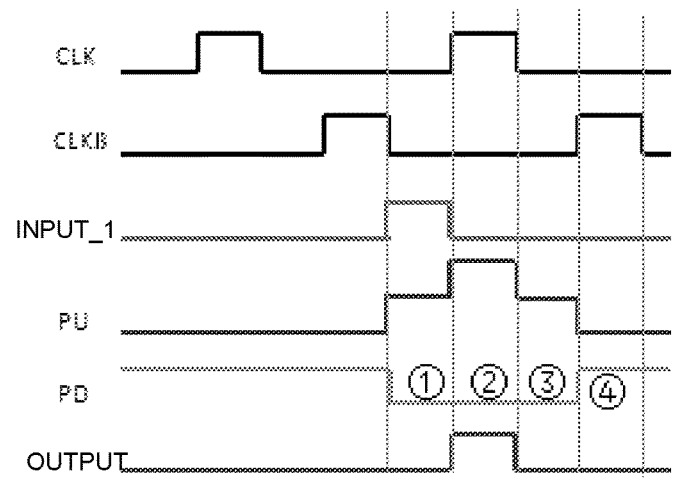
FIG. 7 shows the operating process of the gate drive unit circuit as shown in FIG. 6, and waveform schematic views of respective terminals and nodes.

According to embodiments of the present application, the signal inputted by the first control signal terminal CLK is a first control signal, and the signal inputted by the second control signal terminal CLKB is a second control signal. The first control signal and the second control signal can be clock control signals and have the same cycle and duty ratio, and the phase difference is 180 degrees, as shown in FIG. 7. In one cycle, the ratio of the time length of the first control signal and the second control signal in a high potential state and the time length in a low potential state can be both 25%, i.e., the duty ratios of the first control signal and the second control signal are both 25%, as shown in FIG. 7.

FIG. 7 shows a timing diagram of the gate drive unit circuit as shown in FIG. 7. It should be recognized that FIG. 7 shows respective waveform schematic views by taking an example that the transistors in FIG. 6 are N-type transistors.

As shown in FIG. 7, one cycle for driving the gate drive unit circuit as shown in FIG. 6 includes: an input phase ①, an output phase ②, a first reset phase ③ and a second reset phase ④.

Referring to FIG. 4, FIG. 6 and FIG. 7, in the input phase ①, the signal applied to the first input signal terminal INPUT_1 and the signal applied to the first control terminal CN enable the pull-up node control unit to transmit the high potential of the first voltage terminal VGH to the pull-up node PU under the control of the first node PU_CN, and enable the pull-down node control unit to transmit the low potential of the second voltage terminal VGL to the pull-down node PD under the control of the first node PU_CN. In addition, the signal applied to the second control signal terminal CLKB enables the pull-down node control unit not to transmit the high potential of the first voltage terminal to the pull-down node PD. Specifically, in the input phase ①, the signal applied to the first input signal terminal INPUT_1 can be at a high potential, and the signal applied to the first control signal terminal CLK and the signal applied to the second control signal terminal CLKB can be at a low potential.

According to embodiments of the present application, in the input phase ①, the signal applied to the second control signal terminal CLKB is of low potential, and the fifth transistor M5 of the pull-down node control unit is turned off; hence, the high potential of the first voltage terminal will not be transmitted to the pull-down node PD. Because there is no direct current between the fifth transistor M5 and the sixth transistor M6, the potential of the pull-down node PD can be pulled down to a low potential completely, such that the pull-up node PU will not have electric leakage to the low potential signal VGL through the tenth transistor M10, thereby being capable of reducing the power consumption. In addition, because there is no need to determine the potential of the pull-down node PD by the turn-on resistance ratio of the fifth transistor M5 and the sixth transistor M6, the size of the sixth transistor M6 can be reduced.

In addition, in the input phase ①, the potential of the pull-down node PD is pulled down through the first node PU_CN (rather than the pull-up node PU); hence, direct opposite relation does not exist between the potentials of the pull-up node PU and the pull-down node PD (i.e., if one is of high potential, the other must be of low potential). In the input phase ①, the first node PU_CN can easily pull down the potential of the pull-down node PD; hence, it will not cause that, the pull-up node PU cannot be charged normally due to deterioration of the device characteristics (e.g., the threshold voltage) of the tenth transistor M10. Hence, the gate drive unit circuit according to embodiments of the present application has a relatively high stability.

In the input phase ①, the signal applied to the first input signal terminal INPUT_1 is of high potential, the first control terminal CN is of high potential, and the first transistor M1 is in the turn-on state; hence, the first node PU_CN is at the high potential in this phase, such that the seventh transistor M7 is turned on, thereby transmitting the high potential of the first voltage terminal VGH to the pull-up node PU. Here, the second control signal terminal CLKB is of low potential, the first voltage terminal VGH is of high potential; hence, M9 is turned on, thereby transmitting the low potential signal of the CLKB to the gate of M5, so M5 is turned off. Hence, the high potential signal of VGH cannot be transmitted to the PD. In addition, the first node PU_CN at the high potential enables the sixth transistor M6 to be turned on, thereby transmitting the low potential of the second voltage terminal to the pull-down node PD, which will not be influenced by the high potential of the VGH; hence, it can be kept at a stable low potential. The pull-down node PD at the low potential enables the tenth transistor M10 and the eleventh transistor M11 to be turned off. The pull-up node PU at the high potential enables the third transistor M3 to be turned on. The signal applied to the first control signal terminal CLK is at a low potential. It enables the signal outputted by the output signal terminal OUTPUT to be at a low potential through the third transistor M3 that has been turned on; hence, the eighth transistor M8 is turned off.

In the output phase ②, the signal applied to the first control signal terminal CLK enables the pull-down node control unit to transmit the low potential of the second voltage terminal to the pull-down node PD under the control of the signal outputted by the output signal terminal OUTPUT. Specifically, in the output phase ②, the signal applied to the first control signal terminal CLK can be at a high potential, and the signal applied to the first input signal terminal INPUT_1 and the signal applied to the second control signal terminal CLKB can be at a low potential.

In the output phase ②, the signal applied to the first input signal terminal INPUT_1 is at a low potential, and the first control terminal CN is still of high potential; hence, the first node PU-CN can be at a low potential, so as to enable the sixth transistor M6 and the seventh transistor M7 to be turned off. The signal applied to the first control signal terminal CLK is at a high potential; hence, the output signal terminal OUTPUT is charged to a high potential through the third transistor M3 that has been turned on, so as to charge the pixels. Meanwhile, the pull-up node PU is coupled to a higher potential through the capacitance of the capacitor C1 and the third transistor M3, thereby increasing the charging current, so as to ensure that the gate line can reach the desired voltage more quickly. The signal applied to the second control signal terminal CLKB is at a low potential, the first voltage terminal VGH is of high potential; hence, the signal applied to the gate of the fifth transistor M5 through the ninth transistor M9 that has been turned on is at a low potential. Thereby the fifth transistor M5 is turned off, the high potential of the VGH in this phase still does not influence the potential of the pull-down node PD; moreover, the output signal terminal OUTPUT at the high potential enables the eighth transistor M8 to be turned on, thereby transmitting the low potential of the second voltage terminal VGL to the pull-down node PD, and then the pull-down node PD can still be kept at a stable low potential. The pull-down node PD at the low potential enables the tenth transistor M10 and the eleventh transistor M1 to be turned off. The potential of the output signal terminal OUTPUT in this phase is a high potential.

In the first reset phase ③, the signal applied to the first input signal terminal INPUT_1, the signal applied to the first control signal terminal CLK and the signal applied to the second control signal terminal CLKB all can be at the low potential.

In the first reset phase ③, the pull-up node PU is still kept at the high potential (i.e., the third transistor M3 of the output unit is turned on), whereas the signal applied to the first control signal terminal CLK has become a low potential; hence, the output signal terminal OUTPUT can be discharged to the first control signal terminal CLK through the third transistor M3 of the output unit, and then the signal outputted by the output signal terminal OUTPUT is of low potential. Hence, the TFT M4 for resetting the output signal terminal OUTPUT in the circuit in the prior art as shown in FIG. 1 can be omitted, and the size of the eleventh transistor M11 of the pull-down unit that will operate in the subsequent second reset phase ④ can also be reduced, thereby reducing the space occupied by the gate drive unit.

In the first reset phase ③, the signal applied to the first input signal terminal INPUT_1 is at a low potential, and the first control terminal CN is still of high potential; hence, the first node PU_CN can be at a low potential, so as to enable the sixth transistor M6 and the seventh transistor M7 to be turned off. The signal applied to the second control signal terminal CLKB is at a low potential, and the first voltage terminal VGH is of high potential; hence, the signal applied to the gate of the fifth transistor M5 through the ninth transistor M9 that has been turned on is at a low potential, thereby the fifth transistor M5 is turned off. The signal applied to the first control signal terminal CLK is at a low potential, whereas the pull-up node PU that is kept at the high potential enables the third transistor M3 to be turned on. The output signal terminal OUTPUT at the high potential is discharged to the first control signal terminal CLK that is at the low potential through the third transistor M3 that has been turned on; hence, the signal outputted by the output signal terminal OUTPUT is of low potential, and then M8 is cut off, and the pull-down node PD is kept at a low potential. The pull-down node PD that is at the low potential enables the tenth transistor M10 and the eleventh transistor M11 to be turned off. In this way, the reset of the output signal terminal OUTPUT is finished.

In the second reset phase ④, the signal applied to the second control signal terminal CLKB enables the pull-down node control unit to transmit the high potential of the first voltage terminal to the pull-down node PD, and then enables the pull-down unit to transmit the low potential of the second voltage terminal to the output terminal OUTPUT under the control of the pull-down node PD, so as to reset the output signal terminal OUTPUT, and enable the pull-up node control unit to transmit the low potential of the second voltage terminal to the pull-up node PU under the control of the pull-down node PD, so as to reset the pull-up node PU. Specifically, in the second reset phase ④, the signal applied to the second control signal terminal CLKB can be at a high potential, and the signal applied to the first input signal terminal INPUT_1 and the signal applied to the first control signal terminal CLK can be at a low potential.

Similar to the input phase ① in which the potential of the pull-down node PD can be easily pulled down by the first node PU-CN, in the second reset phase ④, the potential of the pull-up node PU can be easily pulled down by the pull-down node PD. Hence, there is no need to provide an extra reset signal, it only needs to pull up the potential of the pull-down node PD through the high potential applied to the second control signal terminal CLKB, and then pull down the potential of the pull-up node PU and the output signal terminal OUTPUT through the pull-down node PD that is at the high potential. In the circuit in the prior art as shown in FIG. 1, an extra reset signal must be used to pull down the potential of the pull-up node PU so as to enable the pull-up node PU to be reset normally. Because the gate drive unit circuit according to embodiments of the present application does not need to use an extra reset signal, the reset circuit required by the unit circuit of the last stage in the cascade circuit can be omitted, such that the layout of the circuit becomes simple and the space occupied is reduced.

In the second reset phase ④, the signals applied to the first input signal terminal INPUT_1 and the first control signal terminal CLK are both at a low potential, and the first control terminal CN is still of high potential; hence, M1 is turned on, and then the first node PU-CN can be at a low potential, so as to enable the sixth transistor M6 and the seventh transistor M7 to be turned off. The signal applied to the second control signal terminal CLKB is at a high potential, and the first voltage terminal VGH is of high potential; hence, the signal applied to the gate of the fifth transistor M5 through the ninth transistor M9 that has been turned on is at a high potential, thereby the fifth transistor M5 is turned on, so as to transmit the high potential of the first voltage terminal to the pull-down node PD. The pull-down node PD at the high potential enables the tenth transistor M10 and the eleventh transistor M11 to be turned on, thereby transmitting the low potential of the second voltage terminal to the pull-up node PU and the output signal terminal OUTPUT. The pull-up node PU at the low potential enables the third transistor M3 to be turned off, whereas the output signal terminal OUTPUT at the low potential enables the eighth transistor M8 to be turned off.

According to embodiments of the present application, the time lengths of the input phase ①, the output phase ②, the first reset phase ③ and the second reset phase ④ can all be equal.

For example, the transistors in FIG. 6 are N-type transistors, and FIG. 7 shows the signal waveform diagrams of the first input signal terminal INPUT_1, the first control signal terminal CLK, the second control signal terminal CLKB, the output signal terminal OUTPUT, the pull-up node PU and the pull-down node PD in FIG. 6, but the present application is not limited to this. According to embodiments of the present application, one of the potential (i.e., a first potential) of the first voltage terminal and the potential (i.e., a second potential) of the second voltage terminal can be a high potential, while the other of the potential of the first voltage terminal and the potential of the second voltage terminal can be a low potential. The skilled person in the art can adjust the setting manners of the high potential signal and the low potential signal, as well as the waveforms of the control signals applied to respective terminals appropriately based on the type of the transistors for forming the gate drive unit circuit.

Figure 8:
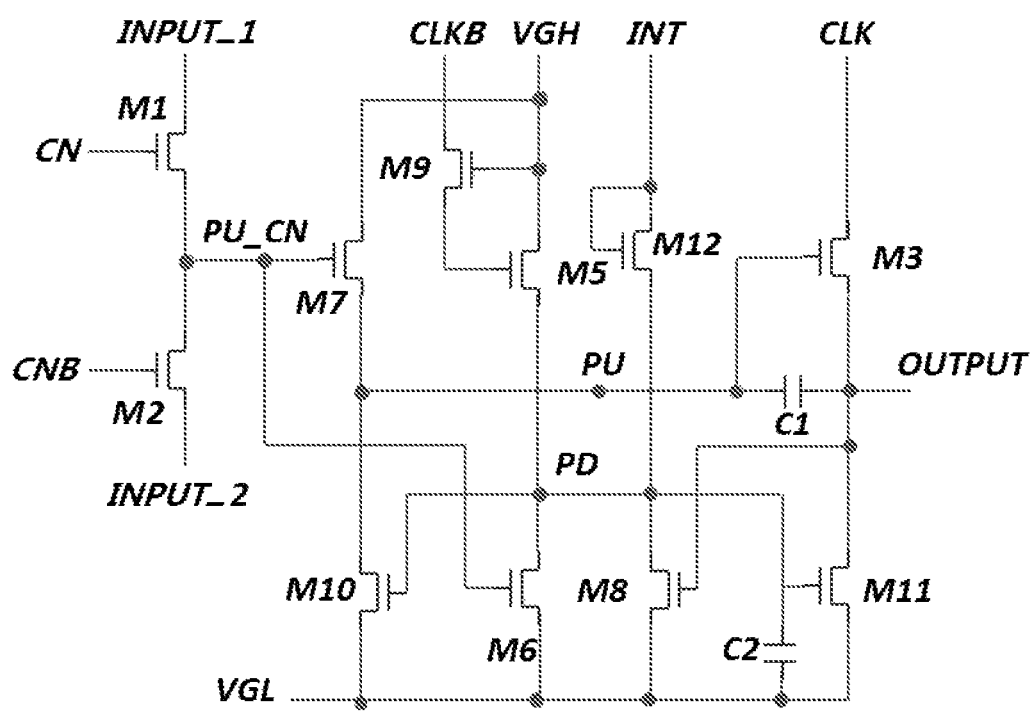
FIG. 8 shows a circuit schematic view of a gate drive unit circuit according to another embodiment of the present application.

FIG. 8 is a circuit schematic view that shows a gate drive unit circuit according to another embodiment of the present application. Compared with the embodiment as shown in FIG. 6, in the embodiment as shown in FIG. 8, the input unit of the gate drive unit circuit can be further connected to a second input signal terminal INPUT_2 and a second control terminal CNB, and is used for transmitting the signal inputted by the first input signal terminal INPUT_1 to the first node PU_CN under the control of the signal inputted by the first control terminal CN, or transmitting the signal inputted by the second input signal terminal INPUT_2 to the first node PU_CN under the control inputted by the second control terminal CNB.

Referring to FIG. 5 and FIG. 8, the input unit of the gate drive unit circuit according to embodiments of the present application can comprise a first transistor M1 and a second transistor M2. The first input signal terminal INPUT_1 is connected to a drain of the first transistor M1, the first control terminal CN is connected to a gate of the first transistor M1, the second input signal terminal INPUT_2 is connected to a drain of the second transistor M2, the second control terminal CNB is connected to a gate of the second transistor M2, and a source of the first transistor M1 and a source of the second transistor M2 are jointly connected to the first node PU_CN.

In the embodiment as shown in FIG. 8, the input unit is connected to the first input signal terminal INPUT_1, the second input signal terminal INPUT_2, the first control terminal CN and the second control terminal CNB, and transmits the signal inputted by the first input signal terminal INPUT_1 to the first node PU_CN under the control of the signal inputted by the first control terminal CN, or transmits the signal inputted by the second input signal terminal INPUT_2 to the first node PU_CN under the control of the signal inputted by the second control terminal CNB. Hence, the signal applied to the first control terminal CN and the signal applied to the second control terminal CNB in the input phase ① enable the input unit to only transmit one of the signal inputted by the first input signal terminal INPUT_1 and the signal inputted by the second input signal terminal INPUT_2 to the first node PU_CN.

In addition, in the embodiments as shown in FIG. 6 and FIG. 8, the gate drive unit circuit further comprises an initial control terminal INT connected to the pull-down node PD via a twelfth transistor M12. The signal applied to the initial control terminal INT is used for performing initialization reset to the gate drive unit circuit, i.e., performing control to the potential of the pull-down node, so as to enable the transistors M10 and M11 to be turned on, so as to perform initialization reset to the pull-up node PU and the output signal terminal OUTPUT.

Figure 9:
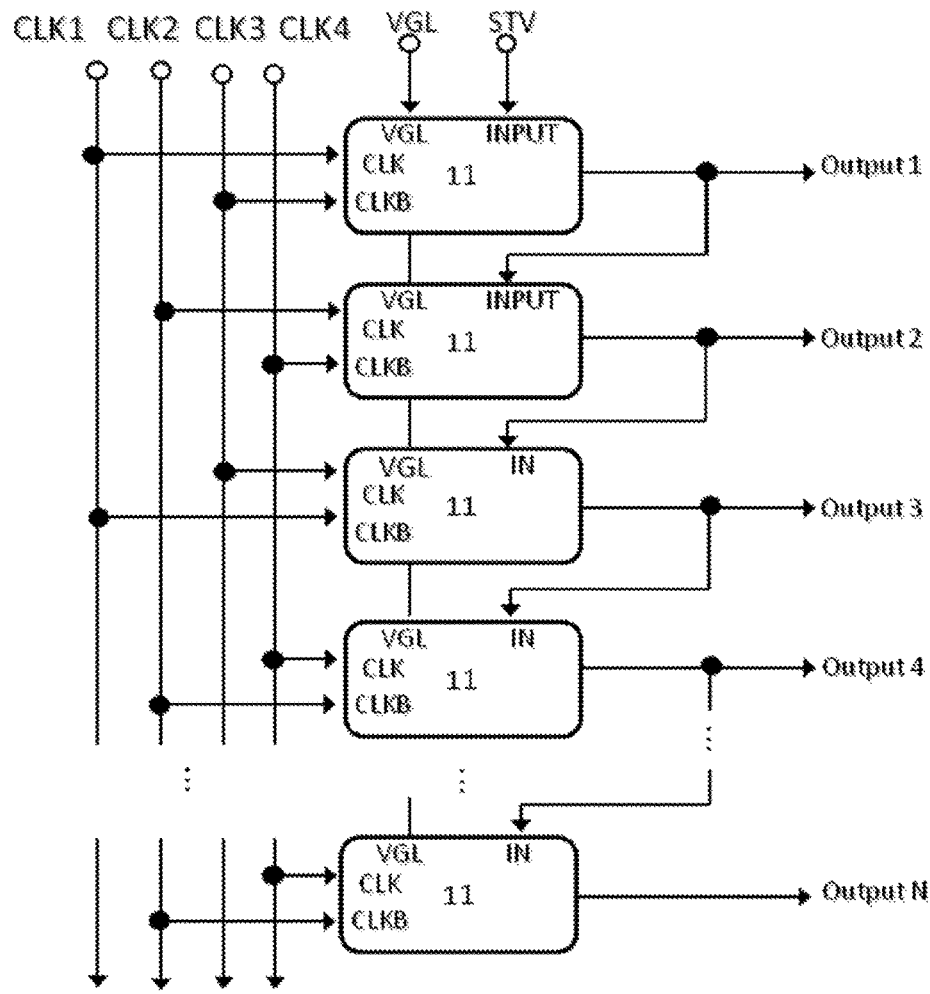
FIG. 9 shows a schematic view of a gate drive circuit according to an embodiment of the present application.
Figure 10:
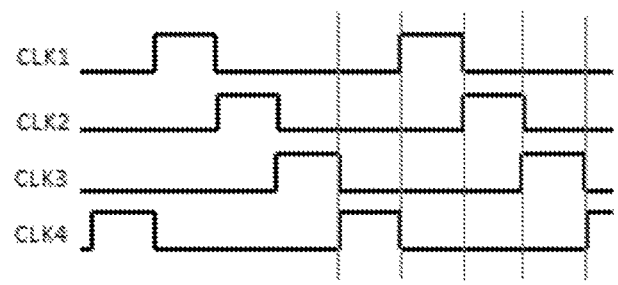
FIG. 10 shows a waveform schematic view of respective control signals for controlling a gate drive circuit according to an embodiment of the present application.

FIG. 9 is a schematic view that shows a gate drive circuit according to an embodiment of the present application. FIG. 10 shows waveform schematic views of respective control signals for controlling the gate drive circuit as shown in FIG. 9. The gate drive circuit as shown in FIG. 9 comprises a plurality of cascaded gate drive unit circuits as shown in FIG. 4 and FIG. 6 (i.e., each gate drive unit circuit only comprises one input signal terminal). However, the gate drive unit circuit as shown in FIG. 5 and FIG. 8 (i.e., each gate drive unit circuit comprises two input signal terminals) can also be used to constitute the gate drive circuit according to the present application.

Referring to FIG. 4, FIG. 6, FIG. 9 and FIG. 10, the output signal terminal OUTPUT of the gate drive unit circuit of one stage is connected to the input signal terminal (e.g., the first input signal terminal INPUT_1) of the gate drive unit circuit of a next stage. The first control signal terminal CLK and the second control signal terminal CLKB of the gate drive unit circuit respectively receive two signals from a first clock signal CLK1 to a fourth clock signal CLK4. The first clock signal CLK1 to the fourth clock signal CLK4 can have the same cycle and duty ratio. In one cycle, the ratio of the time length of the first clock signal CLK1 to the fourth clock signal CLK4 in the high potential state and the time length in the low potential state can be all 25% (i.e., the duty ratio of the first clock signal CLK1 to the fourth clock signal CLK4 is 25%). The phase difference between the second clock signal CLK2 and the first clock signal CKL1 can be 90 degrees, the phase difference between the third clock signal CLK3 and the second clock signal CLK2 can be 90 degrees, and the phase difference between the fourth clock signal CLK4 and the third clock signal CLK3 can be 90 degrees. The first clock signal CLK1 and the third clock signal CLK3 can serve as a first control signal group, for controlling outputs (Output1, Output3, Output5 . . . ) of gate drive unit circuits of odd stages in FIG. 9. The second clock signal CLK2 and the fourth clock signal CLK4 can serve as a second control signal group, for controlling outputs (Output2, Output4, Output6 . . . ) of gate drive unit circuits of even stages in FIG. 9. The first control signal group and the second control signal group can be used respectively to control two gate drive unit circuits of adjacent stages. For example, the first clock signal CLK1 is connected to the first control signal terminal CLK of the gate drive unit circuit of the first stage, and the third clock signal CLK3 is connected to the second control signal terminal CLKB of the gate drive unit circuit of the first stage; the second clock signal CLK2 is connected to the first control signal terminal CLK of the gate drive unit circuit of the second stage, and the fourth clock signal CLK4 is connected to the second control signal terminal CLKB of the gate drive unit circuit of the second stage; the third clock signal CLK3 is connected to the first control signal terminal CLK of the gate drive unit circuit of the third stage, and the first clock signal CLK1 is connected the second control signal terminal CLKB of the gate drive unit circuit of the third stage; the fourth clock signal CLK4 is connected to the first control signal terminal CLK of the gate drive unit circuit of the fourth stage, and the second clock signal CLK2 is connected the second control signal terminal CLKB of the gate drive unit circuit of the fourth stage, and so on.

As stated above, because the gate drive unit circuit according to the present application does not need to use an extra reset signal, the reset circuit required in the unit circuit of the last stage in the cascade circuit can be omitted in the gate drive circuit constituted by the gate drive unit circuit according to the present application, such that the layout of the circuit becomes simple and the space occupied is reduced.

When the gate drive unit circuits as shown in FIG. 5 and FIG. 8 are used to constitute the gate drive circuit according to the present application, the output signal terminal OUTPUT of the gate drive unit circuit of one stage should also be connected to the second input signal terminal INPUT_2 of the gate drive unit circuit of a previous stage, so as to realize bilateral scanning of the gate drive circuit.

As stated above, the signal applied to the first control terminal CN and the signal applied to the second control terminal CNB as shown in FIG. 8 in the input phase enable the input unit only to transmit one of the signal inputted by the first input signal terminal INPUT_1 and the signal inputted by the second input signal terminal INPUT_2 to the first node PU_CN. For example, when the signal applied to the first control terminal CN is of high potential and the signal applied to the second control terminal CNB is of low potential, the signal inputted by the first input signal terminal INPUT_1 can be transmitted to the first node PU_CN, i.e., transmitting the signal inputted by the output signal terminal OUTPUT of the gate drive unit circuit of a previous stage to the first node PU_CN, so as to realize forward scan. For example, when the signal applied to the first control terminal CN is of low potential and the signal applied to the second control terminal CNB is of high potential, the signal inputted by the second input signal terminal INPUT_2 can be transmitted to the first node PU_CN, i.e., transmitting the signal inputted by the output signal terminal OUTPUT of the gate drive unit circuit of a next stage to the first node PU_CN, so as to realize reverse scan.

The gate drive circuit according to the present application can be applied in various display devices, for example, liquid crystal display, large size mosaic screen and display devices including display screens based on various technologies of amorphous silicon (a-Si), oxide, low temperature polycrystalline silicon (LTPS), high temperature polycrystalline silicon (HTPS) etc.

Although embodiments according to the present application have been shown and explained, the ordinary skilled person in the art should understand that various modifications can be made to these exemplary embodiments in forms and details without departing from the spirit and the scope of the concept of the present application defined by the Claims attached.

The invention claimed is:

1. A gate drive unit circuit, comprising an input unit, an output unit, a pull-up node control unit, a pull-down node control unit and a pull-down unit, wherein:

the input unit is connected to the pull-up node control unit and the pull-down node control unit through a first node, the pull-up node control unit is connected to the output unit through a pull-up node, and the pull-down node control unit is connected to the pull-up node control unit and the pull-down unit through a pull-down node, the input unit is connected to a first input signal terminal, a first control terminal and the first node, for transmitting a signal inputted by the first input signal terminal to the first node under control of a signal inputted by the first control terminal, the pull-up node control unit is connected to the first node, the pull-up node, the pull-down node, a first voltage terminal and a second voltage terminal, for transmitting a signal inputted by the first voltage terminal or the second voltage terminal to the pull-up node under control of the first node and the pull-down node, the output unit is connected to the pull-up node, a first control signal terminal and an output signal terminal, for transmitting a signal inputted by the first control signal terminal to the output signal terminal under control of the pull-up node, the pull-down node control unit is connected to the first node, the pull-down node, the first voltage terminal, the second voltage terminal, a second control signal terminal and the output signal terminal, for transmitting the signal inputted by the first voltage terminal or the second voltage terminal to the pull-down node under control of a signal inputted by the second control signal terminal, the first node and a signal outputted by the output signal terminal, the pull-down unit is connected to the pull-down node, the output signal terminal and the second voltage terminal, for transmitting a signal inputted by the second voltage terminal to the output signal terminal under control of the pull-down node, wherein when the pull-up node control unit transmits the signal inputted by the first voltage terminal to the pull-up node under the control of the first node, the signal inputted by the second control signal terminal enables the pull-down node control unit to control a potential of the pull-down node to be unrelated to the signal inputted by the first voltage terminal.

2. A gate drive unit circuit, comprising an input unit, an output unit, a pull-up node control unit, a pull-down node control unit and a pull-down unit, wherein:

the input unit is connected to the pull-up node control unit and the pull-down node control unit through a first node, the pull-up node control unit is connected to the output unit through a pull-up node, and the pull-down node control unit is connected to the pull-up node control unit and the pull-down unit through a pull-down node, the input unit is connected to a first input signal terminal, a first control terminal and the first node, for transmitting a signal inputted by the first input signal terminal to the first node under control of a signal inputted by the first control terminal, the pull-up node control unit is connected to the first node, the pull-up node, the pull-down node, a first voltage terminal and a second voltage terminal, for transmitting a signal inputted by the first voltage terminal or the second voltage terminal to the pull-up node under control of the first node and the pull-down node, the output unit is connected to the pull-up node, a first control signal terminal and an output signal terminal, for transmitting a signal inputted by the first control signal terminal to the output signal terminal under control of the pull-up node, the pull-down node control unit is connected to the first node, the pull-down node, the first voltage terminal, the second voltage terminal, a second control signal terminal and the output signal terminal, for transmitting the signal inputted by the first voltage terminal or the second voltage terminal to the pull-down node under control of a signal inputted by the second control signal terminal, the first node and a signal outputted by the output signal terminal, the pull-down unit is connected to the pull-down node, the output signal terminal and the second voltage terminal, for transmitting a signal inputted by the second voltage terminal to the output signal terminal under control of the pull-down node, wherein, the signal inputted by the first control signal terminal is a first control signal, the signal inputted by the second control signal terminal is a second control signal, the first control signal and the second control signal are clock control signals and have the same cycle and duty ratio, and the phase difference is 180 degrees, in one cycle, the duty ratios of the first control signal and the second control signal are both 25%.

3. A gate drive circuit, comprising a plurality of cascaded gate drive unit circuits, each gate drive unit circuit comprising an input unit, an output unit, a pull-up node control unit, a pull-down node control unit and a pull-down unit, wherein:

the input unit is connected to the pull-up node control unit and the pull-down node control unit through a first node, the pull-up node control unit is connected to the output unit through a pull-up node, and the pull-down node control unit is connected to the pull-up node control unit and the pull-down unit through a pull-down node, the input unit is connected to a first input signal terminal, a first control terminal and the first node, for transmitting a signal inputted by the first input signal terminal to the first node under control of a signal inputted by the first control terminal, the pull-up node control unit is connected to the first node, the pull-up node, the pull-down node, a first voltage terminal and a second voltage terminal, for transmitting a signal inputted by the first voltage terminal or the second voltage terminal to the pull-up node under control of the first node and the pull-down node, the output unit is connected to the pull-up node, a first control signal terminal and an output signal terminal, for transmitting a signal inputted by the first control signal terminal to the output signal terminal under control of the pull-up node, the pull-down node control unit is connected to the first node, the pull-down node, the first voltage terminal, the second voltage terminal, a second control signal terminal and the output signal terminal, for transmitting the signal inputted by the first voltage terminal or the second voltage terminal to the pull-down node under control of a signal inputted by the second control signal terminal, the first node and a signal outputted by the output signal terminal, the pull-down unit is connected to the pull-down node, the output signal terminal and the second voltage terminal, for transmitting a signal inputted by the second voltage terminal to the output signal terminal under control of the pull-down node, wherein an output signal terminal of a gate drive unit circuit of one stage is connected with a first input signal terminal of a gate drive unit circuit of a next stage, and wherein, the first control signal terminal and the second control signal terminal of the gate drive unit circuit receive two signals of a first clock signal, a second clock signal, a third clock signal and a fourth clock signal respectively, wherein the first clock signal to the fourth clock signal have the same cycle and duty ratio, in one cycle, the duty ratios of the first clock signal to the fourth clock signal are all 25%, a phase difference between the second clock signal and the first clock signal is 90 degrees, a phase difference between the third clock signal and the second clock signal is 90 degrees, and a phase difference between the fourth clock signal and the third clock signal is 90 degrees, and wherein the first clock signal and the third clock signal constitute a first control signal group, the second clock signal and the fourth clock signal constitute a second control signal group, the first control signal group controls gate drive unit circuits of odd stages, and the second control signal group controls gate drive unit circuits of even stages.

4. A method for driving a gate drive unit circuit, the gate drive unit circuit comprising an input unit, an output unit, a pull-up node control unit, a pull-down node control unit and a pull-down unit, wherein:

the input unit is connected to the pull-up node control unit and the pull-down node control unit through a first node, the pull-up node control unit is connected to the output unit through a pull-up node, and the pull-down node control unit is connected to the pull-up node control unit and the pull-down unit through a pull-down node, the input unit is connected to a first input signal terminal, a first control terminal and the first node, for transmitting a signal inputted by the first input signal terminal to the first node under control of a signal inputted by the first control terminal, the pull-up node control unit is connected to the first node, the pull-up node, the pull-down node, a first voltage terminal and a second voltage terminal, for transmitting a signal inputted by the first voltage terminal or the second voltage terminal to the pull-up node under control of the first node and the pull-down node, the output unit is connected to the pull-up node, a first control signal terminal and an output signal terminal, for transmitting a signal inputted by the first control signal terminal to the output signal terminal under control of the pull-up node, the pull-down node control unit is connected to the first node, the pull-down node, the first voltage terminal, the second voltage terminal, a second control signal terminal and the output signal terminal, for transmitting the signal inputted by the first voltage terminal or the second voltage terminal to the pull-down node under control of a signal inputted by the second control signal terminal, the first node and a signal outputted by the output signal terminal, the pull-down unit is connected to the pull-down node, the output signal terminal and the second voltage terminal, for transmitting a signal inputted by the second voltage terminal to the output signal terminal under control of the pull-down node, the method comprising an input phase, an output phase, a first reset phase and a second reset phase, wherein, in the input phase, the signal applied to the first input signal terminal and the signal applied to the first control terminal enable the pull-up node control unit to transmit the signal inputted by the first voltage terminal to the pull-up node under the control of the first node, and enable the pull-down node control unit to transmit the signal inputted by the second voltage terminal to the pull-down node under the control of the first node, and wherein the signal applied to the second control signal terminal enables the pull-down node control unit not to transmit the signal inputted by the first voltage terminal to the pull-down node.

5. The method according to claim 4, wherein, in the output phase, the signal applied to the first control signal terminal enables the pull-down node control unit to transmit the signal inputted by the second voltage terminal to the pull-down node under the control of the signal outputted by the output signal terminal.

6. The method according to claim 4, wherein, in the first reset phase, the signal applied to the second control signal terminal enables the pull-down node control unit not to transmit the signal inputted by the first voltage terminal to the pull-down node, and the signal applied to the first input signal terminal enables the output signal terminal to be reset.

7. The method according to claim 4, wherein,
in the second reset phase, the signal applied to the second control signal terminal enables the pull-down node control unit to transmit the signal inputted by the first voltage terminal to the pull-down node, thereby enabling the pull-down unit to transmit the signal inputted by the second voltage terminal to the output signal terminal under the control of the pull-down node, so as to reset the output signal terminal, and enables the pull-up node control unit to transmit the signal inputted by the second voltage terminal to the pull-up node under the control of the pull-down node, so as to reset the pull-up node.

8. The method according to claim 4, wherein,
the time lengths of the input phase, the output phase, the first reset phase and the second reset phase are all equal.

9. The method according to claim 4, wherein,
the input unit is further connected to a second input signal terminal and a second control terminal, and is used for transmitting the signal inputted by the first input signal terminal to the first node under the control of the signal inputted by the first control terminal, or for transmitting a signal inputted by the second input signal terminal to the first node under the control of a signal inputted by the second control terminal, and wherein the method comprises:

the signal applied to the first control terminal and the signal applied to the second control terminal in the input phase enable the input unit to only transmit one of the signal inputted by the first input signal terminal and the signal inputted by the second input signal terminal to the first node.

* * * * *